United States Patent
Yamazaki et al.

(10) Patent No.: US 7,459,023 B2
(45) Date of Patent: Dec. 2, 2008

(54) METHOD FOR PRODUCING SEMICONDUCTOR CRYSTAL

(75) Inventors: Shiro Yamazaki, Aichi-ken (JP); Koji Hirata, Aichi-ken (JP); Katsuhiro Imai, Nagoya (JP); Makoto Iwai, Kasugai (JP); Takatomo Sasaki, Minou (JP); Yusuke Mori, Katano (JP); Masashi Yoshimura, Takarazuka (JP); Fumio Kawamura, Minou (JP); Yuji Yamada, Atsugi (JP)

(73) Assignees: Toyoda Gosei Co., Ltd., Aichi-ken (JP); NGK Insulators, Ltd., Aichi-ken (JP); Osaka University, Osaka-fu (JP)

( * ) Notice: Subject to any disclaimer, the term of this patent is extended or adjusted under 35 U.S.C. 154(b) by 0 days.

(21) Appl. No.: 11/590,930

(22) Filed: Nov. 1, 2006

(65) Prior Publication Data

US 2007/0101931 A1    May 10, 2007

(30) Foreign Application Priority Data

Nov. 2, 2005   (JP)   ............ 2005-319019
Mar. 17, 2006  (JP)   ............ 2006-075223

(51) Int. Cl.
*C30B 25/12*  (2006.01)
(52) U.S. Cl. ............ 117/81; 117/64; 117/68; 117/83; 117/104
(58) Field of Classification Search .......... 117/64, 117/68, 104, 81, 83
See application file for complete search history.

(56) References Cited

U.S. PATENT DOCUMENTS 6,270,569 B1 * 8/2001 Shibata et al. ............ 117/68

2005/0048686 A1   3/2005   Kitaoka et al.

FOREIGN PATENT DOCUMENTS

| JP | 11-060394 | 3/1999 |
|---|---|---|
| JP | 2001-058900 | 3/2001 |
| JP | 2001-064097 | 3/2001 |
| JP | 2004-292286 | 10/2004 |
| JP | 2004-300024 | 10/2004 |

OTHER PUBLICATIONS

German Office Action dated Sep. 14, 2007 with English Translation.

* cited by examiner

*Primary Examiner*—Felisa C Hiteshew
(74) *Attorney, Agent, or Firm*—McGinn IP Law Group, PLLC (57) ABSTRACT

The present invention provides a method for producing a Group III nitride compound semiconductor crystal, the semiconductor crystal being grown through the flux method employing a flux. At least a portion of a substrate on which the semiconductor crystal is to be grown is formed of a flux-soluble material. While the semiconductor crystal is grown on a surface of the substrate, the flux-soluble material is dissolved in the flux from a surface of the substrate that is opposite the surface on which the semiconductor crystal is grown. Alternatively, after the semiconductor crystal has been grown on a surface of the substrate, the flux-soluble material is dissolved in the flux from a surface of the substrate that is opposite the surface on which the semiconductor crystal has been grown. The flux-soluble material is formed of silicon. Alternatively, the flux-soluble material or the substrate is formed of a Group III nitride compound semiconductor having a dislocation density higher than that of the semiconductor crystal to be grown.

20 Claims, 5 Drawing Sheets

METHOD FOR PRODUCING SEMICONDUCTOR CRYSTAL

BACKGROUND OF THE INVENTION

1. Field of the Invention

The present invention relates to the flux method for producing a Group III nitride compound semiconductor crystal, in which a Group III nitride compound semiconductor crystal is grown by use of a flux.

The method of the present invention is effective for reducing semiconductor crystal dislocations or crack density, as well as semiconductor crystal production cost.

2. Background Art

Techniques which have hitherto been known for growing a Group III nitride compound semiconductor crystal through the flux method include those disclosed in, for example, Japanese Patent Application Laid-Open (kokai) Nos. H11-060394, 2001-058900, 2001-064097, 2004-292286, and 2004-300024.

Such a conventional production method generally employs, as a base substrate (seed crystal), a template formed by providing a semiconductor layer (e.g., a buffer layer) on a sapphire substrate, a GaN single-crystal free-standing substrate, or a similar substrate.

In the method disclosed in any of the aforementioned patent documents, a seed crystal is immersed in a flux containing a dissolved Group III element, while an N-containing gas is supplied to the flux, followed by pulling of the seed crystal from the flux.

In the case where a template substrate formed by growing GaN on a sapphire substrate through MOCVD is employed as a seed crystal, when a target Group III nitride compound semiconductor crystal is grown on the seed crystal to a large thickness, a large number of cracks are generated in the semiconductor crystal during removal of the semiconductor crystal from a reaction chamber, because of a great difference in thermal expansion coefficient between the semiconductor crystal and the sapphire substrate. Therefore, when the aforementioned template is employed as a base substrate, difficulty is encountered in producing, for example, a semiconductor crystal of high quality having a thickness of 400 µm or more.

If a GaN single-crystal free-standing substrate is employed as a base substrate, generation of cracks in a target semiconductor crystal may be suppressed, since there is no difference in thermal expansion coefficient between the semiconductor crystal and the base substrate. However, difficulty is encountered in reducing production cost, since a GaN single-crystal free-standing substrate is expensive.

Meanwhile, no supply of a Group III element to a flux during growth of a semiconductor crystal raises a problem in that the Group III element content of the flux is reduced in accordance with progression of growth of the semiconductor crystal, resulting in a decrease in crystal growth rate.

SUMMARY OF THE INVENTION

The present invention has been accomplished in order to solve the aforementioned problems. An object of the present invention is to produce a semiconductor crystal of high quality through the flux method at low cost.

Another object of the present invention is to increase the growth rate of a semiconductor crystal in the flux method.

Yet another object of the present invention is to produce a Group III nitride semiconductor crystal of good quality having no cracks.

Yet another object of the present invention is to facilitate efficient removal of a substrate.

These objects are not necessarily attained simultaneously by one invention, so long as one or more objects are attained by any invention of the present invention.

The aforementioned problems are effectively solved by the below-described means.

In a first aspect of the present invention, there is provided a method for producing a Group III nitride compound semiconductor crystal through the flux method employing a flux, the method comprising growing a semiconductor crystal on a surface of a substrate which is at least partially formed of a material which can be dissolved in a flux (hereinafter the material may be referred to as a "flux-soluble material"), while dissolving the flux-soluble material in the flux from a surface of the substrate that is opposite the surface on which the semiconductor crystal is grown.

The production method according to the first aspect encompasses the case where, even after completion of growth of the Group III nitride compound semiconductor on the substrate, the flux-soluble material is continued to be dissolved in the flux from a surface of the substrate that is opposite the surface on which the semiconductor has been grown. Alternatively, before completion of growth of the Group III nitride compound semiconductor, the entirety of the flux-soluble material or the substrate (in the case where, for example, the entirety of the substrate is formed of the flux-soluble material) may be dissolved in the flux. The entirety of the flux-soluble material (substrate) may be dissolved in the flux at the earliest possible time; i.e., at the time when the thickness of the semiconductor crystal to be grown reaches a threshold thickness at which stable growth of a Group III nitride compound semiconductor starts.

In a second aspect of the present invention, there is provided a method for producing a Group III nitride compound semiconductor crystal through the flux method employing a flux, the method comprising growing a semiconductor crystal on a surface of a substrate which is at least partially formed of a flux-soluble material, and subsequently dissolving the flux-soluble material in the flux from a surface of the substrate that is opposite the surface on which the semiconductor crystal has been grown.

A characteristic feature of the production method according to the first aspect resides in that while the Group III nitride compound semiconductor crystal is grown on the substrate, the flux-soluble material or the substrate (in the case where the entirety of the substrate is formed of the flux-soluble material) is dissolved in the flux from a surface of the substrate that is opposite the surface on which the semiconductor crystal is grown. In contrast, a characteristic feature of the production method according to the second aspect resides in that after the Group III nitride compound semiconductor crystal has been grown on the substrate, the flux-soluble material or the substrate (in the case where the entirety of the substrate is formed of the flux-soluble material) is dissolved in the flux from a surface of the substrate that is opposite the surface on which the semiconductor crystal has been grown.

In the above-described production methods according to the first and second aspects, no particular limitation is imposed on the flux-soluble material to be employed. However, from the viewpoint of production cost, the flux-soluble material is preferably a material which is less expensive than a GaN single-crystal free-standing substrate. The flux-soluble material is preferably a material which is relatively easily dissolved in a hot alkali. The flux-soluble material may be appropriately selected as desired from among known seed crystal materials. More specifically, the flux-soluble material may be, for example, silicon (Si), GaAs, or another known flux-soluble material.

If a Group III nitride compound semiconductor has a dislocation density higher than that of a single-crystal semiconductor to be grown, the Group III nitride compound semiconductor can be easily dissolved in a flux. When such a Group III nitride compound semiconductor is to be employed, the semiconductor is preferably a GaN free-standing substrate having a dislocation density of $1 \times 10^6$ cm$^{-2}$ or more and $1 \times 10^{10}$ cm$^{-2}$ or less. When the dislocation density is excessively low, the GaN free-standing substrate is difficult to dissolve in the aforementioned flux, whereas when the dislocation density is excessively high, the quality of a semiconductor crystal to be grown on the GaN free-standing substrate is impaired. When a lower half portion (as viewed in a thickness direction) of a substrate formed of a single material has a high dislocation density, or a portion (as viewed in a direction parallel to the surface) of such a single material substrate has a high dislocation density, the high-dislocation-density portion may be defined as a flux-soluble material.

No particular limitation is imposed on the aforementioned flux-soluble material, so long as it remains undissolved at least until the aforementioned semiconductor crystal is grown to have such a thickness that the crystal can stably serve by itself as a seed crystal for crystal growth. Therefore, from the viewpoint of production efficiency, most preferably, almost the entirety of the flux-soluble material is dissolved in a flux by the time when the semiconductor crystal is grown to have a desired thickness. Such a preferred state can be attained by appropriately determining the thickness of the flux-soluble material or other conditions.

The aforementioned Group III nitride compound semiconductor for crystal growth encompasses a two-component semiconductor, a three-component semiconductor, a four-component semiconductor which is represented by the formula: $Al_{1-x-y}Ga_yIn_xN$ ($0 \leq x \leq 1$, $0 \leq y \leq 1$, $0 \leq x+y \leq 1$) and has arbitrary compound crystal proportions, and a semiconductor containing a p-type or n-type impurity.

Specifically, in the present invention, at least a portion of the substrate to be employed may be formed of a flux-soluble material, or the entirety of the substrate may be formed of a flux-soluble material. As used herein, the expression "at least a portion of the substrate is formed of a flux-soluble material" may refer to the case where the substrate has a two-layer structure including, in a thickness direction, a portion formed of a flux-soluble material and a portion formed of a flux-insoluble material. For example, the substrate may have a two-layer structure including GaN (substrate for crystal growth) and Si (flux-soluble material), or a two-layer structure including a Group III nitride compound semiconductor having a low dislocation density (e.g., a GaN substrate for crystal growth) and a Group III nitride compound semiconductor having a dislocation density higher than that of the substrate for crystal growth (e.g., GaN (flux-soluble material) having a dislocation density of $1 \times 10^6$ cm$^{-2}$ or more). A portion of the substrate (as viewed in a direction parallel to the surface) may be formed of a flux-soluble material similar to that described above. For example, the substrate may have a structure in which a peripheral portion thereof is formed of a flux-insoluble material, and the entirety of a center portion thereof is formed of a flux-soluble material. Alternatively, the substrate may have a structure in which a portion as viewed in a direction parallel to the surface is formed of a flux-soluble material in a lattice-shaped pattern.

Needless to say, in the production method of the present invention, the entirety of the substrate may be formed of the aforementioned flux-soluble material.

In the production method of the present invention, preferably, the flux-soluble material is dissolved in the flux at a temperature near the growth temperature of the semiconductor crystal.

During the course of growth of the semiconductor crystal, the flux-soluble material may be dissolved in the flux at a temperature near the growth temperature of the semiconductor crystal. Alternatively, after growth of the semiconductor crystal, the flux-soluble material may be dissolved in the flux at a temperature near the growth temperature of the semiconductor crystal.

In the production method of the present invention, preferably, at least a portion of the aforementioned flux-soluble material contains an impurity which controls the carrier concentration of the aforementioned semiconductor crystal. Such an impurity may be an n-type impurity or a p-type impurity. The flux-soluble material may contain both n-type and p-type impurities. The entirety of the flux-soluble material may be formed solely of such an impurity.

In the production method of the present invention, preferably, the aforementioned flux-soluble material is silicon (Si).

In the production method of the present invention, a protective film may be formed on an exposed surface of the aforementioned flux-soluble material so that the thickness or formation pattern of the protective film controls the time when the flux-soluble material is dissolved in the flux or the dissolution rate of the flux-soluble material.

Examples of the material for forming such a protective film include aluminum nitride (AlN) and tantalum (Ta). Such a protective film may be formed through any well-known technique, such as crystal growth, vacuum deposition, or sputtering.

The aforementioned film formation pattern may be formed through any well-known technique, such as photolithography or etching. The smaller the thickness of the protective film, the earlier the aforementioned dissolution time. The greater the area of a portion of the aforementioned flux-soluble material exposed to the flux, the higher the aforementioned dissolution rate.

In the production method of the present invention, preferably, the flux-soluble material is formed of a Group III nitride compound semiconductor having a dislocation density higher than that of the semiconductor crystal to be grown.

In the production method, the flux-soluble material may be formed as follows.

The substrate for crystal growth may be formed of a two-component semiconductor, a three-component semiconductor, or a four-component semiconductor which is represented by the formula: $Al_{1-x-y}Ga_yIn_xN$ ($0 \leq x \leq 1$, $0 \leq y \leq 1$, $0 \leq x+y \leq 1$) and has arbitrary compound crystal proportions. The Group III nitride compound semiconductor may contain a p-type or n-type impurity. The semiconductor constituting the flux-soluble material is most preferably GaN. The crystal dislocation density of the flux-soluble material constituting at least a portion of the substrate, or the crystal dislocation density of the entirety of the substrate (in the case where the entirety of the substrate is formed of the flux-soluble material) is preferably $1 \times 10^6$ cm$^{-2}$ or more, more preferably $1 \times 10^7$ cm$^{-2}$ or more, most preferably $1 \times 10^8$ cm$^{-2}$ or more. In order to improve crystallinity of the Group III nitride compound semiconductor to be grown on the substrate, the dislocation density is preferably regulated to $1 \times 10^{10}$ cm$^{-2}$ or less.

The aforementioned Group III nitride compound semiconductor crystal to be grown is preferably GaN.

The substrate may contain an impurity which controls the carrier concentration of the semiconductor crystal to be grown. Such an impurity may be an n-type impurity or a p-type impurity. The substrate may contain both n-type and p-type impurities.

Preferably, the thickness of the substrate is regulated to such a thickness that the entirety of the substrate is dissolved in the flux at the time of completion of growth of the semiconductor crystal. Through such a thickness regulation, a Group III nitride compound semiconductor of good quality having low dislocation density can be produced, since the substrate having a dislocation density higher than that of the semiconductor is completely dissolved in the flux at the time of completion of liquid-phase growth of the Group III nitride compound semiconductor.

A protective film may be formed on an exposed surface of the substrate; for example, the surface (back surface) opposite the surface for crystal growth, so that the thickness or formation pattern of the protective film controls the time when the substrate is dissolved in the flux or the dissolution rate of the substrate. Examples of the material for forming such a protective film include aluminum nitride (AlN) and tantalum (Ta). Such a protective film may be formed through any well-known technique, such as crystal growth, vacuum deposition, or sputtering.

The aforementioned film formation pattern may be formed through any well-known technique, such as photolithography or etching. The smaller the thickness of the protective film, the earlier the aforementioned dissolution time. The greater the area of a portion of the substrate exposed to the flux, the higher the aforementioned dissolution rate. Dissolution of the substrate in the flux starts at the time when the exposed portion of the substrate comes into contact with the flux of high temperature, and the dissolution rate is almost proportional to the area of the exposed portion. Therefore, the time at which dissolution of the substrate starts, the time required for dissolution of the substrate, the dissolution rate, etc. may be controlled as desired by appropriately determining the thickness of the protective film and the area of the exposed portion of the substrate. The time required for dissolution of the substrate may be regulated by varying, for example, the compositional proportions or thickness of the substrate, or the temperature of the flux. When the impurity contained in the substrate is employed as an impurity added to the semiconductor crystal to be grown on the substrate, the impurity concentration of the semiconductor crystal may be regulated as desired by appropriately controlling the time required for dissolution of the substrate or the dissolution rate thereof.

Effects of the above-described present invention are as follows.

Specifically, in the production method of the present invention, during the course of growth of a semiconductor crystal or after completion of growth of the semiconductor crystal, a flux-soluble material is dissolved in a flux at a temperature near the growth temperature of the semiconductor crystal. Thus, when a target semiconductor crystal is removed from a reaction chamber, stress—which would otherwise occur due to, for example, a decrease in temperature upon removal of the semiconductor crystal from the reaction chamber—is not applied between the semiconductor crystal and the base substrate. Therefore, according to the present invention, the crack density of the semiconductor crystal can be considerably reduced as compared with the case of a conventional semiconductor crystal.

The flux-soluble material to be employed may be a relatively inexpensive material such as silicon (Si). Therefore, according to the present invention, production cost can be reduced as compared with the case of a conventional technique employing a GaN single-crystal free-standing substrate as a base substrate.

According to the present invention, dissolution of the flux-soluble material in the flux can be employed as a technique for addition of an impurity. Therefore, addition of an impurity does not require any other technique. Furthermore, a necessary impurity material can be saved.

Such a flux-soluble material may be, for example, silicon (Si).

According to the present invention, dissolution of the flux-soluble material in the flux starts at the time when the exposed portion of the flux-soluble material comes into contact with the flux of high temperature, and the dissolution rate is almost proportional to the area of the exposed portion. Therefore, the time at which dissolution of the flux-soluble material starts, the time required for dissolution of the material, the dissolution rate, etc. may be controlled as desired by appropriately determining the area of the exposed portion of the flux-soluble material or other conditions. The time required for dissolution of the flux-soluble material may be regulated as desired by varying, for example, the type or thickness of the flux-soluble material, or the temperature of the flux.

In the production method of the present invention, when the flux-soluble material is employed as an impurity added to a target semiconductor crystal to be grown on the material, the impurity concentration of the semiconductor crystal may be regulated as desired by appropriately controlling the time required for dissolution of the flux-soluble material or the dissolution rate thereof.

In the production method of the present invention, the flux-soluble material constituting at least a portion of the substrate on which a Group III nitride compound semiconductor crystal is to be grown is formed of a Group III nitride compound semiconductor having a dislocation density higher than that of the semiconductor crystal to be grown. The semiconductor crystal is grown on a surface of the substrate, while the flux-soluble material or the substrate (in the case where the entirety of the substrate is formed of the flux-soluble material) is dissolved in the flux from a surface of the substrate that is opposite the surface on which the semiconductor crystal is grown. The solubility of nitrogen (i.e., a Group V element) in the flux solution is increased through dissolution of the flux-soluble material (substrate), and thus the growth rate of the Group III nitride semiconductor can be increased. Also, the solubility of a Group III element is increased through dissolution of the flux-soluble material (substrate), and thus depletion of the Group III element associated with crystal growth on the substrate can be reduced. Therefore, a decrease in the compositional ratio of the Group III element to Na or an additive in the flux can be suppressed, and introduction of Na or the additive into the crystal can be prevented.

Alternatively, the flux-soluble material constituting at least a portion of the substrate on which a Group III nitride compound semiconductor crystal is to be grown is formed of a Group III nitride compound semiconductor having a dislocation density higher than that of the semiconductor crystal to be grown, and, after the semiconductor crystal has been grown on a surface of the substrate, the flux-soluble material or the substrate (in the case where the entirety of the substrate is formed of the flux-soluble material) is dissolved in the flux from a surface of the substrate that is opposite the surface on which the semiconductor crystal has been grown. Since a semiconductor crystal of high dislocation density exhibits a rate of dissolution in the flux higher than that of a semiconductor crystal of low dislocation density, the flux-soluble material (substrate) can be removed with the thus-grown semiconductor crystal being left. Therefore, removal of the flux-soluble material (substrate) is not required after removal of the grown semiconductor crystal from a crystal growth apparatus; i.e., the production process for the semiconductor crystal is simplified.

When the dislocation density of the flux-soluble material or the substrate (in the case where the entirety of the substrate is formed of the flux-soluble material) is regulated to $1 \times 10^6$ cm$^{-2}$ or more, the substrate can be readily dissolved in the flux.

When both the substrate and the semiconductor crystal to be grown are formed of GaN, a best-quality semiconductor crystal can be produced.

DETAILED DESCRIPTION OF PREFERRED EMBODIMENTS

The alkali metal constituting a flux to be employed is particularly preferably sodium (Na). Lithium (Li) may also be employed.

The nitrogen (N)-containing gas to be employed may be nitrogen gas ($N_2$), ammonia gas ($NH_3$), or a mixture of these gases.

The aforementioned p-type impurity (acceptor) to be added may be, for example, a known p-type impurity such as an alkaline earth metal (e.g., magnesium (Mg) or calcium (Ca)). The aforementioned n-type impurity (donor) to be added may be, for example, a known n-type impurity such as silicon (Si), sulfur (S), selenium (Se), tellurium (Te), or germanium (Ge). Two or more impurity (acceptor or donor) elements may be added simultaneously, or both p-type and n-type impurities may be added simultaneously. Such an impurity can be added to a to-be-grown target semiconductor crystal by, for example, dissolving the impurity in the flux in advance, or adding the impurity to the substrate.

No particular limitation is imposed on the crystal growth apparatus to be employed, so long as the flux method can be carried out by means of the apparatus. For example, a crystal growth apparatus described in any of Japanese Patent Application Laid-Open (kokai) Nos. H11-060394, 2001-058900, 2001-064097, 2004-292286, and 2004-300024 may be employed. When crystal growth is performed through the flux method, preferably, the temperature of a reaction chamber of a crystal growth apparatus to be employed may be raised or lowered as desired to about 1,000° C. Preferably, the pressure of the reaction chamber may be increased or decreased as desired to about 100 atm (about $1.0 \times 10^7$ Pa). The electric furnace, reaction container, raw material gas tank, piping, etc. of a crystal growth apparatus to be employed are preferably formed of, for example, a stainless steel (SUS) material, an alumina material, or copper.

In the Group III nitride compound semiconductor represented by the aforementioned compositional formula, which constitutes the target semiconductor crystal, at least a portion of the aforementioned Group III element (Al, Ga, or In) may be substituted with, for example, boron (B) or thallium (Tl); or at least a portion of nitrogen (N) may be substituted with, for example, phosphorus (P), arsenic (As), antimony (Sb), or bismuth (Bi).

The present invention will next be described with reference to specific embodiments, which should not be construed as limiting the invention thereto.

First Embodiment

1. Preparation of Base Substrate

Figure 1:
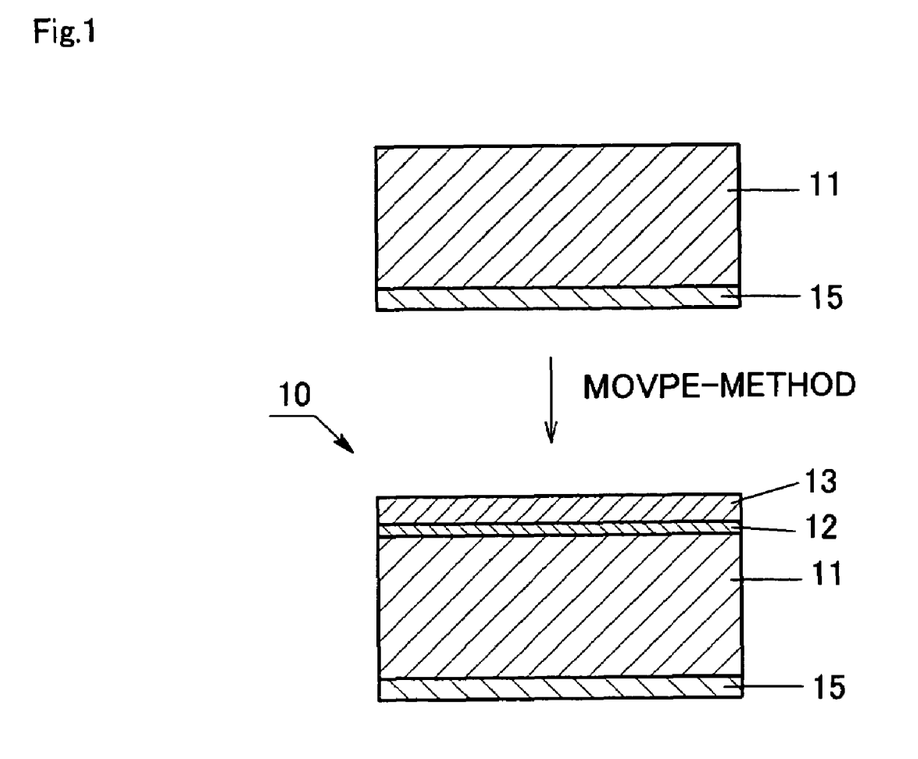
FIG. 1 is a cross-sectional view showing a template 10 prepared in a first embodiment.

Next will be described, with reference to FIG. 1, a procedure for producing a base substrate (template 10) employed in the crystal growth step of the flux method.

(1) Firstly, a protective film 15 is formed on the back surface of a silicon substrate 11 (flux-soluble material). The protective film 15 may be formed by providing an AlN layer on the substrate through MOVPE or a similar technique. Alternatively, the protective film 15 may be formed of an appropriate metal such as tantalum (Ta) by means of a sputtering apparatus or a vacuum deposition apparatus.

(2) Subsequently, through crystal growth by MOVPE, an AlGaN buffer layer 12 (thickness: about 4 µm) is formed on the silicon substrate 11 (thickness: about 400 µm), and a GaN layer 13 is formed on the buffer layer 12. The GaN layer 13 could be dissolved in a flux to some extent by the time when growth of a target semiconductor crystal is initiated through the flux method. Therefore, the GaN layer 13 is formed to have such a thickness that it is not completely dissolved in the flux until crystal growth is initiated.

The template 10 (base substrate) can be prepared through the above-described steps (1) and (2).

2. Configuration of Crystal Growth Apparatus

Figure 2:
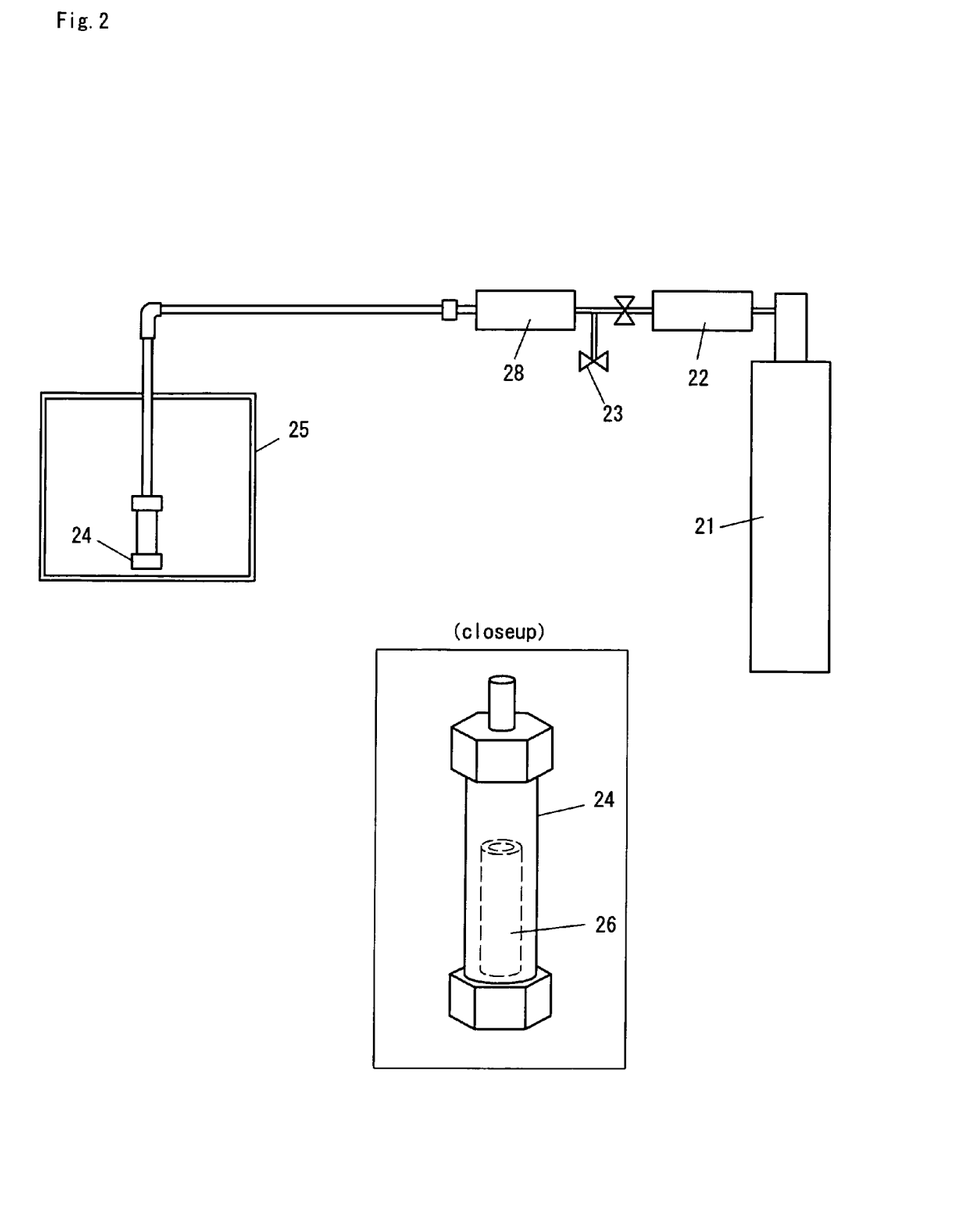
FIG. 2 shows the configuration of a crystal growth apparatus employed in the first embodiment.

FIG. 2 shows the configuration of a crystal growth apparatus employed in the first embodiment. The crystal growth apparatus includes a raw material gas tank 21 for supplying nitrogen gas; a pressure regulator 22 for regulating the pressure of a crystal growth atmosphere; a leakage valve 23; and an electric furnace 25 for performing crystal growth. The electric furnace 25, the piping for connecting the raw material gas tank 21 to the electric furnace 25, etc. are formed of, for example, a stainless steel (SUS) material, an alumina material, or copper.

The electric furnace 25 includes a stainless steel container 24 (reaction chamber) therein, and the stainless steel container 24 includes a crucible 26 (reaction container) therein. The crucible 26 may be formed of, for example, boron nitride (BN) or alumina ($Al_2O_3$).

The temperature of the interior of the electric furnace 25 may be raised or lowered as desired, so long as the temperature does not exceed 1,000° C. The crystal growth pressure of the interior of the stainless steel container 24 may be increased or decreased as desired by means of the pressure regulator 22, so long as the pressure does not exceeds $1.0 \times 10^7$ Pa.

3. Crystal Growth Step

Figure 3A:
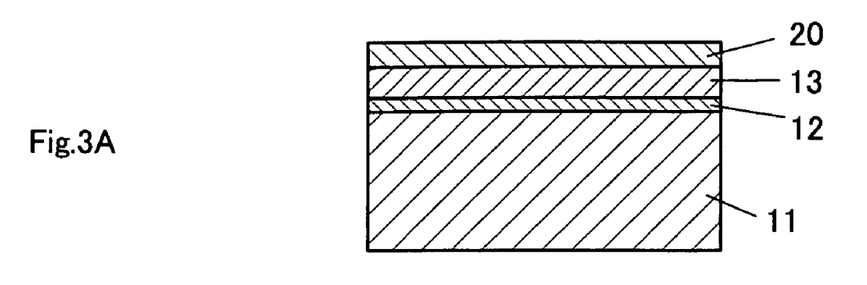
FIG. 3A is a cross-sectional view showing a semiconductor crystal grown in the first embodiment.

Next will be described, with reference to FIGS. 3A to 3C, the crystal growth step of the flux method employing the crystal growth apparatus shown in FIG. 2.

(1) Firstly, Na (alkali metal) serving as a flux and Ga (Group III element) are placed in the reaction container (crucible 26), and the reaction container (crucible 26) is placed in the reaction chamber (stainless steel container 24) of the crystal growth apparatus, followed by evacuation of the gas contained in the reaction chamber. If necessary, any of the aforementioned additives (e.g., an alkaline earth metal) may be added to the crucible in advance. Setting of the substrate or the raw material in the reaction container is carried out in a glove box filled with an inert gas (e.g., Ar gas), since, when such an operation is performed in air, Na is immediately oxidized.

(2) Subsequently, while the temperature of the crucible is raised to fall within a range of 850° C. to 880° C., nitrogen gas ($N_2$) is fed into the reaction chamber of the crystal growth apparatus, and the gas pressure in the reaction chamber is maintained at about 3 to about 5 atm (about $3 \times 10^5$ to about $5 \times 10^5$ Pa). In this case, the protective film 15 of the above-prepared template 10 is immersed in a Ga—Na melt formed through the above temperature rising, and the crystal growth surface of the template 10 (i.e., the exposed surface of the GaN layer 13) is located in the vicinity of the interface between the melt and the nitrogen gas.

Under the above-described conditions, the atoms constituting the material for a Group III nitride compound semiconductor are continuously in a supersaturated state in the vicinity of the interface between the Ga—Na melt and the nitrogen gas. Therefore, a target semiconductor crystal (n-type GaN single-crystal 20) can be successfully grown on the crystal growth surface of the template 10 (FIG. 3A). The reason why the n-type semiconductor crystal (n-type GaN single-crystal 20) is obtained is that Si, which constitutes the silicon substrate 11 dissolved in the flux, is added as an n-type additive to the crystal during growth thereof (FIG. 3B).

The protective film 15 may be formed to have a large thickness so that the silicon substrate 11 is not dissolved in the flux during the crystal growth step. In this case, a semiconductor crystal which is not doped with silicon (Si) can be grown.

4. Dissolution of Crystal Growth Substrate

Figure 3B:
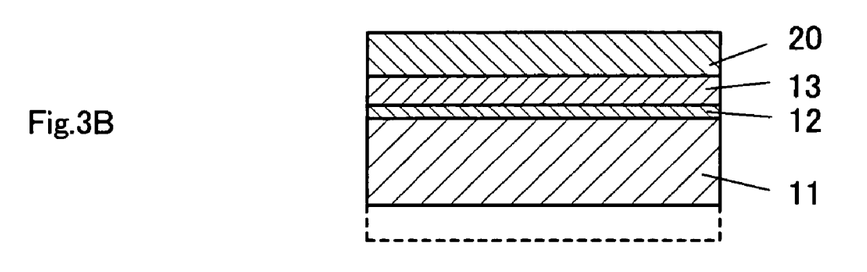
FIG. 3B is a cross-sectional view showing the semiconductor crystal grown in the first embodiment.
Figure 3C:
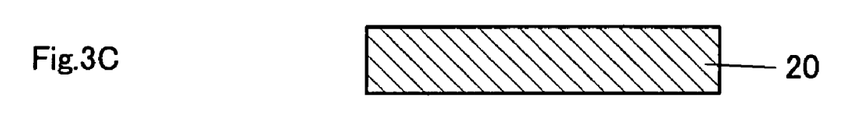
FIG. 3C is a cross-sectional view showing the semiconductor crystal grown in the first embodiment.

After the n-type GaN single-crystal 20 is grown to have a sufficient thickness (e.g., about 500 μm or more) through the above-described crystal growth step, the temperature of the crucible is continued to be maintained at 850° C. or higher and 880° C. or lower until the protective film 15 and the silicon substrate 11 are completely dissolved in the flux (FIGS. 3B and 3C). Thereafter, while the pressure of the nitrogen gas ($N_2$) is maintained at about 3 to about 5 atm (about $3 \times 10^5$ to about $5 \times 10^5$ Pa), the temperature of the reaction chamber is lowered to 100° C. or less.

The step of dissolving the silicon substrate 11 in the flux and the above temperature lowering step may be carried out somewhat in parallel. As described above, at least a portion of the protective film 15 or the silicon substrate 11 may be dissolved in the flux during growth of the GaN single-crystal 20. The mode of parallel/simultaneous progress of these steps can be appropriately regulated by varying, for example, the form of the protective film 15.

5. Removal of Flux

Subsequently, the above-grown n-type GaN single-crystal 20 (target semiconductor crystal) is removed from the reaction chamber of the crystal growth apparatus, and the single-crystal is cooled to 30° C. or lower. Thereafter, while the temperature of an atmosphere surrounding the n-type GaN single-crystal 20 is maintained at 30° C. or lower, the flux (Na) deposited on the periphery of the single-crystal is removed by use of ethanol.

When the above-described steps are sequentially carried out, there can be produced, through the flux method and at low cost, a high-quality semiconductor single-crystal (n-type GaN single-crystal 20) which has a thickness of 400 μm or more and has considerably reduced cracks as compared with the case of a conventional semiconductor single-crystal.

[Other Modifications]

The present invention is not limited to the above-described embodiment, and the below-exemplified modifications may be made. Effects of the present invention can also be obtained through such modifications or applications according to the operation of the present invention.

(First Modification)

In the aforementioned first embodiment, the base substrate (seed crystal) is prepared by forming the protective film 15 on the back surface of the template 10. However, the protective film is not necessarily formed on the back surface of the base substrate. For example, without formation of a protective film on the back surface of a template as described above, the thickness of a flux-soluble material (Si substrate 11) may be regulated to such a level that the flux-soluble material is completely dissolved in the flux by the time when a target semiconductor crystal is grown to have a predetermined thickness in accordance with the rate of etching of the flux-soluble material under predetermined crystal growth conditions.

In the modification, a step of dissolving the flux-soluble material in the flux can be omitted, which is advantageous in terms of productivity. In the aforementioned first embodiment, during the step of dissolving the flux-soluble material constituting the base substrate in the flux, a target semiconductor crystal which has been grown is dissolved and lost in the flux to some extent. However, when the aforementioned modification is performed, the flux-soluble material (Si substrate 11) is etched during the crystal growth step, and therefore a step of dissolving the flux-soluble material in the flux is not required to be provided. Therefore, with the aforementioned modification, loss of a grown semiconductor crystal can be minimized.

When the thickness of the protective film is appropriately regulated, dissolution of the flux-soluble material (Si substrate 11) in the flux can be prevented for a while after initiation of crystal growth. Therefore, an undoped semiconductor layer can be formed directly on the template 10, and a silicon (Si)-doped n-type semiconductor layer can be formed on the undoped semiconductor layer.

(Second Modification)

In the aforementioned first embodiment, the base substrate (seed crystal) is prepared by uniformly forming the protective film 15 on the back surface of the template 10. However, the protective film may be subjected to etching by use of an appropriate etching pattern, so as to expose a portion of the back surface of the flux-soluble material through apertures formed through etching. In this case, from the beginning of crystal growth, the thus-exposed portion of the flux-soluble material comes into contact with the flux, and is dissolved in the flux. Therefore, in the modification, for example, the time required for dissolution of the flux-soluble material constituting the base substrate, or the dissolution rate of the flux-soluble material can be optimized. The dissolution rate of the flux-soluble material, etc. can be optimized by regulating, for example, the size of the apertures formed in the protective film through which a portion of the back surface of the flux-soluble material is exposed, or the arrangement density of the apertures.

When the flux-soluble material is formed of silicon (Si), and the aforementioned apertures are formed, the flux-soluble material can be employed as an n-type impurity from the early stage of crystal growth. Therefore, from the beginning of crystal growth, an n-type semiconductor crystal having an appropriate carrier concentration can be formed as a target semiconductor crystal. The carrier concentration of the semiconductor crystal can be optimized by regulating, for example, the dissolution rate of the flux-soluble material. The aforementioned apertures of the protective film on the back surface of the flux-soluble material can be formed through a generally well-known etching technique including, for example, a photolithography step and a dry etching step.

Second Embodiment

1. Preparation of Substrate

Figure 4:
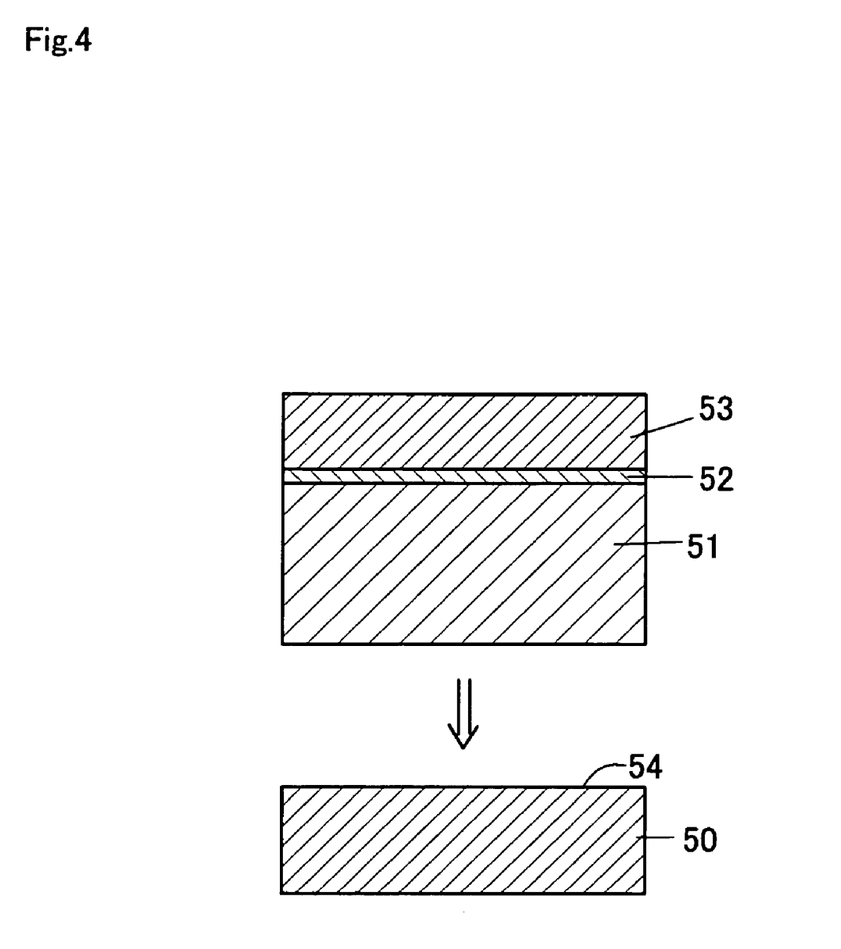
FIG. 4 is a cross-sectional view showing a GaN substrate prepared in a second embodiment.

Next will be described, with reference to FIG. 4, a procedure for preparing a substrate employed as a seed crystal in the crystal growth step of the flux method.

(1) Firstly, by means of an MOCVD apparatus, an AlN buffer layer 52 (thickness: 35 nm) is formed on a sapphire substrate 51, and a GaN layer 53 (thickness: 200 μm) is formed on the AlN buffer layer 52. The GaN layer 53 may be formed through HVPE. After completion of growth of the GaN layer 53, the sapphire substrate 51 is removed from the GaN layer 53 through a laser lift-off technique, to thereby yield a GaN substrate 50 formed of the GaN layer 53. The GaN substrate 50 was found to have a dislocation density of $5 \times 10^7$ cm$^{-2}$.

2. Configuration of Crystal Growth Apparatus

The crystal growth apparatus employed in the second embodiment has the same configuration as that of the apparatus employed in the first embodiment (see FIG. 2).

3. Crystal Growth Step

Figure 5A:
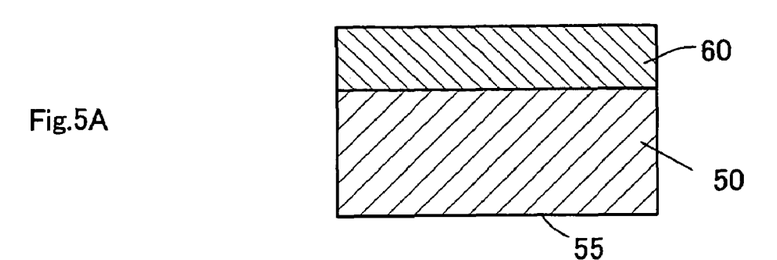
FIG. 5A is a cross-sectional view showing a semiconductor crystal grown in the second embodiment.
Figure 5B:
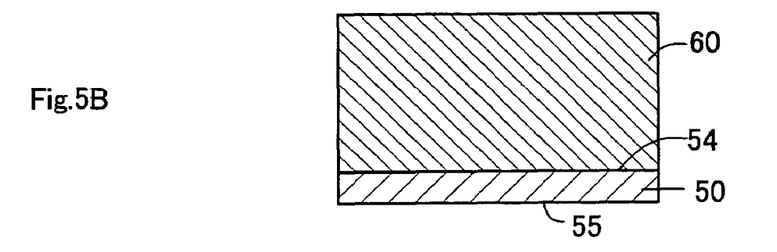
FIG. 5B is a cross-sectional view showing the semiconductor crystal grown in the second embodiment.
Figure 5C:
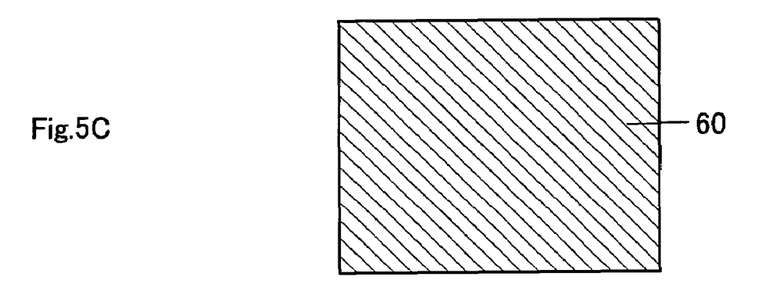
FIG. 5C is a cross-sectional view showing the semiconductor crystal grown in the second embodiment.

Next will be described, with reference to FIGS. 5A to 5C, the crystal growth step of the flux method employing the crystal growth apparatus shown in FIG. 2.

(1) Firstly, Na (alkali metal) serving as a flux and Ga (Group III element) are placed in the reaction container 26 (crucible), and the above-prepared GaN substrate 50 is placed in the reaction container 26. In this case, the GaN substrate 50 is placed in the reaction container 26 such that the crystal growth surface of the substrate assumes a Ga surface, and the opposite surface thereof assumes an N surface. The reaction container 26 is placed in the reaction chamber (stainless steel container 24) of the crystal growth apparatus, followed by evacuation of the gas contained in the reaction chamber 24. If necessary, any of the aforementioned additives (e.g., an alkaline earth metal) may be added to the reaction container 26 in advance. Setting of the substrate or the raw material in the reaction container is carried out in a glove box filled with an inert gas (e.g., Ar gas), since, when such an operation is performed in air, Na is immediately oxidized.

(2) Subsequently, while the temperature of the reaction container 26 is raised to 850° C. or higher and 880° C. or lower, nitrogen gas (N$_2$) is fed into the reaction chamber 24 of the crystal growth apparatus, and the gas pressure in the reaction chamber 24 is maintained at about 30 to about 50 atm (about $3 \times 10^6$ to about $5 \times 10^6$ Pa). In this case, the GaN substrate 50 may be placed on a mesh susceptor (not illustrated) so that the level of the GaN substrate 50 can be regulated (specifically, the back surface of the GaN substrate 50 can be immersed in a Ga—Na melt formed through the above temperature rising, and the crystal growth surface 54 of the GaN substrate 50 can be located in the vicinity of the interface between the melt and the nitrogen gas), and that the entirety of the GaN substrate 50 can come into contact with the flux solution. Alternatively, the GaN substrate 50 may be placed on the inner bottom of the crucible. The reaction chamber 24 may be swung or rotated during crystal growth so that the GaN substrate 50 and the flux solution come into contact with each other thoroughly and uniformly.

Under the above-described conditions, the atoms constituting the material for a Group III nitride compound semiconductor are continuously in a supersaturated state in the flux. Therefore, a target GaN semiconductor crystal 60 can be successfully grown on the crystal growth surface of the substrate 50 (FIG. 5A).

4. Dissolution of Crystal Growth Substrate

During the above-described crystal growth step, the GaN substrate 50 is dissolved in the Ga—Na melt from the back surface 55. The GaN substrate 50 has a dislocation density of $5 \times 10^7$ cm$^{-2}$, and the grown GaN single-crystal 60 has a dislocation density as low as $1 \times 10^3$ cm$^{-2}$. Therefore, the GaN substrate 50 of higher dislocation density is dissolved in the flux solution at higher rate as compared with the grown GaN single-crystal 60. As a result, the solubility of nitrogen in the flux solution is increased, and the crystal growth rate is increased. Through dissolution of the substrate, Ga is dissolved in the flux, and thus Ga consumed for crystal growth on the substrate surface can be compensated. Therefore, an increase in Na/Ga ratio in the flux and migration of Na and additives into the crystal can be prevented, and a homogenous semiconductor crystal can be obtained (FIG. 5B).

Preferably, the temperature of the flux solution, the thickness of the GaN substrate 50, etc. are regulated so that dissolution of the entirety of the GaN substrate in the flux is completed simultaneously with completion of growth of the GaN single-crystal 60. When the GaN substrate 50 is not completely dissolved in the flux at the time of completion of growth of the GaN single-crystal 60, after crystal growth, the temperature of the reaction container 26 is continued to be maintained at 850° C. or higher and 880° C. or lower until the GaN substrate 50 is completely dissolved in the flux. Through this procedure, the entirety of the GaN substrate 50 is dissolved, and merely the GaN single-crystal 60 of low dislocation density is produced (FIG. 5C). Thereafter, while the pressure of the nitrogen gas (N$_2$) is maintained at about 30 to about 50 atm (about $3 \times 10^6$ to about $5 \times 10^6$ Pa), the temperature of the reaction chamber is lowered to 100° C. or lower.

The step of dissolving the GaN substrate 50 in the flux and the above temperature lowering step may be carried out somewhat in parallel.

5. Removal of Flux

Subsequently, the GaN single-crystal 60 (target semiconductor crystal) is removed from the reaction chamber 24 of the crystal growth apparatus, and the single-crystal is cooled to 30° C. or lower. Thereafter, while the temperature of an atmosphere surrounding the GaN single-crystal 60 is maintained at 30° C. or lower, the flux (Na) deposited on the periphery of the single-crystal is removed by use of ethanol.

When the above-described steps are sequentially carried out, there can be produced, through the flux method, a homogeneous, high-quality GaN single-crystal 60 which has a thickness of 400 μm or more, which has stoichiometric compositional proportions, and which has considerably reduced cracks as compared with the case of a conventional semiconductor single-crystal.

[Other Modifications]

The present invention is not limited to the above-described embodiment, and the below-exemplified modifications may be made. Effects of the present invention can also be obtained through such modifications or applications according to the operation of the present invention.

(Third Modification)

Figure 6:
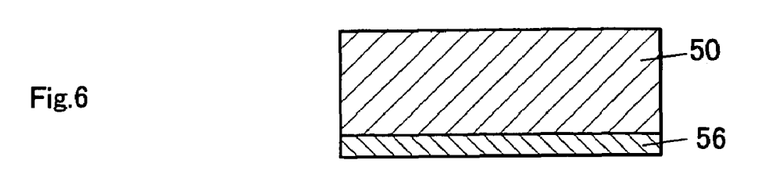
FIG. 6 is a cross-sectional view showing a substrate employed in a modification.

As shown in FIG. 6, a protective film 56 may be formed on the back surface 55 of the substrate 50. The protective film 56 may be formed by providing an AlN layer on the substrate through MOVPE or a similar technique. Alternatively, the protective film 56 may be formed of an appropriate metal such as tantalum (Ta) by means of a sputtering apparatus or a vacuum deposition apparatus.

The timing at which the substrate 50 is dissolved in the flux from its back surface can be regulated by varying the thickness of the protective film 56. The protective film 56 may be formed to have a large thickness so that the substrate 50 is not dissolved in the flux during the crystal growth step.

When the substrate 50 is dissolved in the flux even after completion of growth of the semiconductor crystal 60, the temperature of the reaction container 26 may be continued to be maintained at 850° C. or higher and 880° C. or lower so that the protective film 56 and the substrate 50 are completely dissolved in the flux.

In the case where the protective film 56 is not employed, the thickness of the substrate 50 is regulated so that dissolution of the entirety of the substrate 50 in the flux is completed simultaneously with completion of growth of the single-crystal 60. In contrast, in the case where the protective film 56 is employed, the timing at which the substrate 50 is completely dissolved can be regulated by varying the thickness of the substrate 50, or such a timing can be regulated by varying merely the thickness of the protective film 56 while maintaining the thickness of the substrate 50 constant.

In the modification, a step of dissolving the substrate in the flux can be omitted, which is advantageous in terms of productivity.

In the aforementioned second embodiment, during the step of dissolving the substrate 50 in the flux, a target semiconductor crystal which has been grown is dissolved and lost in the flux to some extent. However, when the aforementioned modification is performed, the substrate 50 is etched during the crystal growth step, and therefore a step of dissolving the substrate 50 in the flux is not required to be provided after crystal growth. Therefore, with the aforementioned modification, loss of a grown semiconductor crystal can be minimized.

When the thickness of the protective film is appropriately regulated, dissolution of the substrate 50 in the flux can be prevented for a while after initiation of crystal growth.

(Fourth Modification)

As described above, the protective film 56 may be uniformly formed on the back surface of the substrate 50. Alternatively, the protective film 56 may be subjected to etching by use of an appropriate etching pattern, so as to expose a portion of the back surface of the substrate 50 through apertures formed through etching. In this case, from the beginning of crystal growth, the thus-exposed portion of the substrate 50 comes into contact with the flux, and is dissolved in the flux. Therefore, in the modification, for example, the time required for dissolution of the substrate 50 or the dissolution rate thereof can be optimized. The dissolution rate of the substrate 50, etc. can be optimized by regulating, for example, the size of the apertures formed in the protective film 56 through which a portion of the back surface 55 of the substrate 50 is exposed, or the arrangement density of the apertures. The apertures of the protective film 56 on the back surface 55 of the substrate 50 can be formed through a generally well-known etching technique including, for example, a photolithography step and a dry etching step.

The present invention is useful for the production of a semiconductor device from a Group III nitride compound semiconductor crystal. Examples of such a semiconductor device include light-emitting devices (e.g., LEDs and LDs), light-receiving devices, and other general semiconductor devices (e.g., FETs).

What is claimed is:

1. A method for producing a Group III nitride compound semiconductor crystal through a flux method employing a flux, the method comprising:
   growing a semiconductor crystal on a surface of a substrate which is at least partially formed of a flux-soluble material which can be dissolved in the flux,
   wherein the flux-soluble material is dissolved in the flux from a surface of the substrate that is opposite the surface on which the semiconductor crystal is grown during said growing said semiconductor crystal,
   wherein said flux-soluble material comprises a Group III nitride compound semiconductor having a dislocation density higher than that of the semiconductor crystal to be grown, and
   wherein said flux-soluble material has a crystal dislocation density of $1 \times 10^6$ cm$^{-2}$ or greater.

2. The semiconductor crystal production method according to claim 1, wherein the entirety of the substrate comprises the flux-soluble material.

3. The semiconductor crystal production method according to claim 2, wherein the flux-soluble material is dissolved in the flux at a temperature near a growth temperature of the semiconductor crystal.

4. The semiconductor crystal production method according to claim 1, wherein the flux-soluble material is dissolved in the flux at a temperature near a growth temperature of the semiconductor crystal.

5. The semiconductor crystal production method according to claim 1, wherein at least a portion of the flux-soluble material comprises an impurity which controls a carrier concentration of the semiconductor crystal.

6. The semiconductor crystal production method according to claim 1, wherein the flux-soluble material comprises Si.

7. The semiconductor crystal production method according to claim 1, wherein a protective film is formed on an exposed surface of the flux-soluble material such that any of a thickness and a formation pattern of the protective film controls one of a timing of when the flux-soluble material is dissolved in the flux and a dissolution rate of the flux-soluble material.

8. The semiconductor crystal production method according to claim 1, wherein the semiconductor crystal to be grown comprises GaN.

9. The semiconductor crystal production method according to claim 1, wherein the flux-soluble material of the substrate comprises GaN.

10. The semiconductor crystal production method according to claim 1, wherein a thickness of the flux-soluble material is regulated such that an entirety of the flux-soluble material is dissolved in the flux when a growth of the semiconductor crystal is complete.

11. The semiconductor crystal production method according to claim 1, wherein said Group III nitride compound semiconductor having a dislocation density higher than that of the semiconductor crystal to be grown comprises a semiconductor compound represented by $Al_{1-x-y}Ga_yIn_xN$, where $0 \leq x \leq 1$, $0 \leq y \leq 1$, and $0 \leq x+y \leq 1$.

12. A method for producing a Group III nitride compound semiconductor crystal through a flux method employing a flux, the method comprising:
   growing a semiconductor crystal on a surface of a substrate which is at least partially formed of a flux-soluble material which can be dissolved in the flux,
   wherein the flux-soluble material is dissolved in the flux from a surface of the substrate that is opposite the surface on which the semiconductor crystal has been grown after said growing said semiconductor crystal,
   wherein said flux-soluble material comprises a Group III nitride compound semiconductor having a dislocation density higher than that of the semiconductor crystal to be grown, and
   wherein said flux-soluble material has a crystal dislocation density of $1 \times 10^6$ cm$^{-2}$ or greater.

13. The semiconductor crystal production method according to claim 12, wherein the entirety of the substrate comprises the flux-soluble material.

14. The semiconductor crystal production method according to claim 12, wherein the flux-soluble material is dissolved in the flux at a temperature near a growth temperature of the semiconductor crystal.

15. The semiconductor crystal production method according to claim 12, wherein at least a portion of the flux-soluble material comprises an impurity which controls a carrier concentration of the semiconductor crystal.

16. The semiconductor crystal production method according to claim 12, wherein the flux-soluble material comprises Si.

17. The semiconductor crystal production method according to claim 12, wherein a protective film is formed on an exposed surface of the flux-soluble material such that any of a thickness and a formation pattern of the protective film controls one of a timing of when the flux-soluble material is dissolved in the flux and a dissolution rate of the flux-soluble material.

18. The semiconductor crystal production method according to claim 12, wherein the semiconductor crystal to be grown comprises GaN.

19. The semiconductor crystal production method according to claim 12, wherein the flux-soluble material of the substrate comprises GaN.

20. A method for producing a Group III nitride compound semiconductor crystal through a flux method employing a flux, the method comprising:
   growing a semiconductor crystal on a surface of a substrate which comprises a flux-soluble material that can be dissolved in the flux,
   wherein the flux-soluble material is fully dissolved in the flux from a surface of the substrate that is opposite the surface of the substrate on which the semiconductor crystal is grown when said growing said semiconductor crystal is finished, and
   wherein said substrate comprises Si.

* * * * *